(12) United States Patent
Furuta et al.

(10) Patent No.: US 9,236,569 B2
(45) Date of Patent: Jan. 12, 2016

(54) STORAGE ELEMENT

(71) Applicant: Funai Electric Co., Ltd., Daito-shi, Osaka (JP)

(72) Inventors: Shigeo Furuta, Tsukuba (JP); Yuichiro Masuda, Takatsuki (JP); Tsuyoshi Takahashi, Inagi (JP); Masatoshi Ono, Tsukuba (JP); Yutaka Hayashi, Tsukuba (JP); Taro Itaya, Ushiku (JP); Yasuhisa Naitoh, Tsukuba (JP); Tetsuo Shimizu, Tsukuba (JP)

(73) Assignee: Funai Electric Co., Ltd., Osaka (JP)

( * ) Notice: Subject to any disclaimer, the term of this patent is extended or adjusted under 35 U.S.C. 154(b) by 0 days.

(21) Appl. No.: 14/525,269

(22) Filed: Oct. 28, 2014

(65) Prior Publication Data

US 2015/0123069 A1    May 7, 2015

(30) Foreign Application Priority Data

Nov. 5, 2013    (JP) .................................. 2013-229188

(51) Int. Cl.
*H01L 45/00*    (2006.01)

(52) U.S. Cl.
CPC ............ *H01L 45/1253* (2013.01); *H01L 45/04* (2013.01); *H01L 45/1233* (2013.01); *H01L 45/16* (2013.01)

(58) Field of Classification Search
CPC ..... H01L 45/04; H01L 45/10; H01L 45/1226; H01L 45/1233; H01L 45/1253
See application file for complete search history.

(56) References Cited

U.S. PATENT DOCUMENTS 3,522,590 A * 8/1970 Bashara ................ H01L 45/145
257/E45.002
7,961,505 B2 * 6/2011 Sasaki .......................... 365/159

FOREIGN PATENT DOCUMENTS

JP    2008-243986 A    10/2008

OTHER PUBLICATIONS

Goux et al., "Field-driven ultrafast sub-ns programming in W/Al2O3/Ti/CuTe-based 1T1R CBRAM system", Symposium on VLSI Technology Digest of Technical Papers, 2012, pp. 69-70.

* cited by examiner

*Primary Examiner* — Mark Prenty
(74) *Attorney, Agent, or Firm* — Keating & Bennett, LLP

(57) ABSTRACT

A storage element includes a first electrode and a second electrode separated by a gap and a dielectric layer provided between the first electrode and the second electrode to fill the gap. A separation distance of the gap changes in response to application of a voltage to a space between the first electrode and the second electrode, such that a switching phenomenon is produced which switches a resistance state between the first electrode and the second electrode between a high resistance state in which it is difficult for tunnel current to flow and a low resistance state in which it is easy for tunnel current to flow.

17 Claims, 8 Drawing Sheets

STORAGE ELEMENT

BACKGROUND OF THE INVENTION

1. Field of the Invention

The present invention relates to a storage element.

2. Description of the Related Art

Electronic components now need to become even smaller as devices shrink and become denser. One known example of this is a storage element that can control electrical resistance by applying voltage between two electrodes separated by a minute gap (nanogap).

Such storage elements are constituted such that a nanometer order gap (for example, 10 nm or less) is provided between electrodes, and by electrically changing the separation distance of this gap, a tunnel current between the electrodes is controlled. The tunnel current changes greatly even if the separation distance of the gap between the electrodes (electrode gap) changes by only about 0.1 nm, but the shape of the electrode surface that determines the separation distance of the electrode gap is vulnerable to the effects of the state of the gas within the electrode gap, so the electrode gap must be hermetically sealed in order to increase its operating stability. Proposals to this end include encapsulating the entire storage element in a sealing material, installing a sealing dielectric that covers the electrode gap and maintains it without plugging it, and covering the aperture portion of a hole that exposes a portion of one of the two electrodes (first electrode) with the other electrode (second electrode) (for example, see Japanese Patent Application Laid-Open Publication No. 2008-243986).

There are problems, however, including: when the entire storage element is encapsulated with a sealing material in order to hermetically seal the electrode gap, a vacuum must be created inside the sealing material, for example; when a sealing dielectric is installed that covers the electrode gap and maintains it without plugging it, the sealing dielectric must be formed within a vacuum state, for example; and when covering the aperture portion of a hole that exposes a portion of the first electrode with the second electrode, the second electrode must be formed within a vacuum state, for example. Because there are limits to how great a vacuum can be formed using a vacuum pump or the like, however, the electrode gap cannot be hermetically sealed in a reliable manner.

Furthermore, with a conventional storage element such as that described in Japanese Patent Application Laid-Open Publication No. 2008-243986, the electrode gap is hollow, so there is the problem of difficulty forming electrode gaps with the desired separation distance with good reproducibility because of the effects of manufacturing disparities.

SUMMARY OF THE INVENTION

Preferred embodiments of the present invention provide a storage element which is configured to provide an electrode gap with a desired separation distance with good reproducibility and also in which the electrode gap is hermetically sealed in a reliable manner.

According to a preferred embodiment of the present invention, a storage element includes a first electrode and a second electrode disposed so as to be separated by a gap and a dielectric layer provided between the first electrode and the second electrode so as to fill in the gap, wherein a separation distance of the gap is configured to change in response to application of a specified voltage to a space between the first electrode and the second electrode, and a switching phenomenon is produced which switches a resistance state between the first electrode and the second electrode between a high resistance state in which it is difficult for tunnel current to flow and a low resistance state in which it is easy for tunnel current to flow.

The dielectric layer preferably is a dielectric thin film with a softened inter-atomic bond structure.

The dielectric layer preferably is anisotropic in a lamination direction and a lamination plane direction.

The dielectric layer preferably has a thickness of about 3 nm or less.

The first electrode and the second electrode each preferably include a base portion configured such that the base portion on the first electrode side and the base portion on the second electrode side face each other across a separation distance that enables a tunnel current to be generated, at least one of the first electrode and the second electrode includes a low-melting-point portion in a region where the base portions face each other, and when the first electrode includes the low-melting-point portion, the low-melting-point portion is made of a substance with a melting point lower than a substance that constitutes the base portion on the first electrode side, and when the second electrode includes the low-melting-point portion, the low-melting-point portion is made of a substance with a melting point lower than the substance that constitutes the base portion on the second electrode side.

The low-melting-point portion is preferably provided at least in one of the first electrode and the second electrode that has a relatively higher potential when the voltage is applied.

The low-melting-point portion may preferably be provided in both the first electrode and the second electrode.

With various preferred embodiments of the present invention, the separation distance of the gap between electrodes (initial value) is configured to be controlled precisely by controlling a thickness of the dielectric layer configured to fill in the gap between the first electrode and the second electrode (electrode gap), so it is possible to provide a storage element that is able to provide an electrode gap having a desired separation distance with good reproducibility without being affected by manufacturing disparities.

Moreover, because the gap between the first electrode and the second electrode (electrode gap) is filled in with a dielectric layer, a storage element that hermetically seals the electrode gap is provided reliably.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
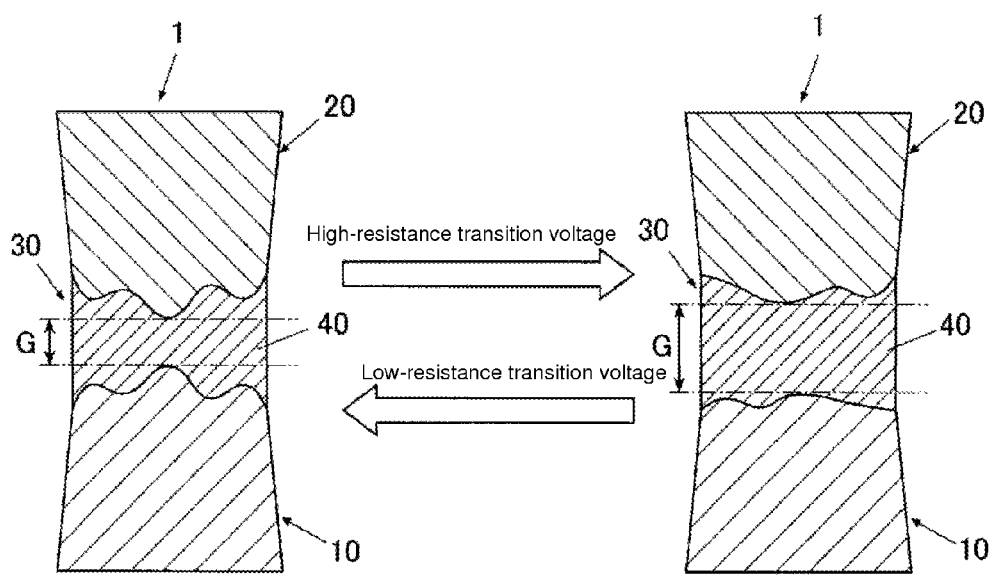
FIG. 1 is a sectional view showing in model form portions of the storage element according to a first preferred embodiment of the present invention.

Preferred embodiments of the present invention will be described below using drawings. However, the scope of the present invention is not limited to the examples described with reference to preferred embodiments of the present invention and shown in the drawings.

First Preferred Embodiment

A storage element 1 is a switching element which switches a resistance value between nanogap electrodes (between a first electrode 10 and a second electrode 20 that are disposed so as to be separated by a nanometer order gap 30), for example, to store data.

In concrete terms, as shown in FIG. 1, for example, the storage element 1 is configured to include the first electrode 10 and the second electrode 20 as nanogap electrodes and a dielectric layer 40 that is provided between the first electrode 10 and the second electrode 20 so as to fill in the gap 30 between the first electrode 10 and the second electrode 20 (electrode gap).

The first electrode 10 defines a pair with the second electrode 20, for example, and is configured to perform a switching operation of the storage element 1.

There are no particular restrictions on the shape of the first electrode 10, and the shape can be freely changed as appropriate.

There are no particular restrictions on the material of the first electrode 10 (that is, the substance that constitutes the first electrode 10) so long as it is conductive and is not copper or tellurium; for example, it is preferable that it be at least one selected from among gold, silver, platinum, palladium, nickel, aluminum, cobalt, chromium, rhodium, titanium, tungsten, tantalum, carbon, or alloys thereof.

The second electrode 20 defines a pair with the first electrode 10, for example, and is configured to perform the switching operation of the storage element 1.

There are no particular restrictions on the shape of the second electrode 20, and it can be freely changed as appropriate.

There are no particular restrictions on the material of the second electrode 20 (that is, the substance that constitutes the second electrode 20) so long as it is conductive and is not copper or tellurium; for example, it is preferable that it be at least one selected from among gold, silver, platinum, palladium, nickel, aluminum, cobalt, chromium, rhodium, titanium, tungsten, tantalum, carbon, or alloys thereof.

The gap 30 is provided between the first electrode 10 and the second electrode 20, for example, and is configured to produce the resistance value change phenomenon of the storage element 1.

In concrete terms, the gap 30 is configured to generate the switching phenomenon that changes the resistance status by changing the separation distance of this gap 30, i.e., the gap separation distance G, as a result of a specified voltage being applied between the first electrode 10 and the second electrode 20, for example.

Specifically, the storage element 1 of the present preferred embodiment is configured so as to shift the resistance state between the first electrode 10 and the second electrode 20 to a high-resistance state in which it is difficult for tunnel current to flow by expanding the gap separation distance G with the application of a high-resistance transition voltage and so as to shift the resistance state between the first electrode 10 and the second electrode 20 to a low-resistance state in which it is easy for tunnel current to flow by narrowing the gap separation distance G with the application of a low-resistance transition voltage.

The dielectric layer 40 is configured so as to fill in the gap 30, for example, and to hermetically seal the gap 30.

There are no particular restrictions on the substance of the dielectric layer 40, i.e., the substance that constitutes the dielectric layer 40, so long as it is dielectric; for example, $AlO_x$ (where x is a number close to 3/2), $SiN_y$ (where y is a number close to 4/3), or $SiO_z$ (where z is a number close to 3/2) are desirable.

In the storage element 1 of the present preferred embodiment, the gap 30 is hermetically sealed by adopting a structure in which the dielectric layer 40 is provided between the first electrode 10 and the second electrode 20 so as to fill in the gap 30, and the hollow portion that separates the two electrodes in a conventional storage element is replaced with the dielectric layer 40. By doing so, the storage element 1 of the present preferred embodiment becomes a solid-state element similar to a normal silicon integrated circuit, so there is no need, for example, to encapsulate the entire storage element with a sealing member as in the case of conventional storage elements. Furthermore, the gap 30 preferably is sufficiently hermetically sealed compared, for example, to when the entire storage element is encapsulated with a sealing member as in conventional storage elements.

Moreover, when the gap between electrodes (electrode gap) is hollow as in conventional storage elements, it is difficult to control the separation distance of the electrode gap with high precision, so it is difficult to form an electrode gap having a desired separation distance with good reproducibility. By contrast, in the storage element 1 of the present preferred embodiment, the thickness of the dielectric layer 40 becomes the separation distance of the gap 30, so it is easy to accurately and reliably form a gap (electrode gap) 30 having the desired separation distance with good reproducibility. That is, it is easy to control the thickness of the dielectric layer 40 with high precision, and the separation distance of the gap 30 (initial value) is precisely defined by this dielectric layer 40, which is controlled with high precision, so the gap 30 having a desired separation distance (initial value) is provided with good reproducibility without being affected by manufacturing disparities. In addition, by providing the dielectric layer 40 between the first electrode 10 and the second electrode 20 so as to fill in the gap 30, microstructural changes of the electrode are significantly reduced or prevented, which increases its stability when driven or stored. Consequently, disparities in electrical characteristics due to manufacturing tolerances are significantly reduced or prevented, and durability in repeated operation is also increased. Note that "initial value" refers to the separation distance of the gap 30 at the time of manufacturing.

Thus, the storage element of the present preferred embodiment significantly increases manufacturing yield, improves operational stability, and realizes hermetic sealing and the like, on the element level.

In the storage element 1 of the present preferred embodiment, a switching phenomenon is produced which switches the resistance state between the first electrode 10 and the second electrode 20 by changing the separation distance of the gap 30. Accordingly, the structure of the dielectric layer 40 preferably is a structure that does not impede changes in the separation distance of the gap 30.

If the dielectric layer 40 is fabricated by atomic layer deposition (ALD) or the like, the dielectric layer 40 is formed with a structure that does not impede changes in the separation distance of the gap 30, for example.

For example, in atomic layer deposition, atoms are stacked on one layer at a time in order, so the mode of the bonds of the constituent atoms with each other (shifts in the bond angle from the monocrystalline atomic structure and distances between atoms, the manner in which defects enter, etc.) will differ in the direction of lamination (direction of film thickness) and within the plane of lamination. That is, they are anisotropic in the lamination direction and the lamination plane direction.

However, with dielectric films that are deposited with a low-temperature film manufacturing technology such as atomic layer deposition, low-temperature chemical vapor deposition which includes chemical vapor deposition that uses a catalyst (cat-CVD), sputtering, or vapor deposition, an amorphous structure is obtained in which inter-atomic bonds are softened from their monocrystalline or polycrystalline bond state (with the bond angle from the monocrystalline or polycrystalline atomic structure and the distances between atoms being shifted), and because of this, there are many voids or defects on a level that allows metal atoms to move within the film (in various preferred embodiments of the present invention, a dielectric film that has this atomic bond mode will be referred to as "dielectric thin film with a softened inter-atomic bond structure"). Note that atomic layer deposition is a technology that is capable of fabricating a uniform film thickness even when the substrate is uneven; it is a technology suitable for fabricating the dielectric film of various preferred embodiments of the present invention, in particular, dielectric films with thicknesses of about 3 nanometer or less, for example.

As was described above, the structure of the dielectric layer 40 fabricated by the atomic layer deposition method results in a "dielectric thin film with a softened inter-atomic bond structure," and the metal atoms of the first electrode or second electrode move, in response to and under the influence of voltage applied between the electrodes, through voids or defects that exist randomly within this dielectric layer 40, so the separation distance of the gap 30 changes equivalently.

Meanwhile, when there is anisotropy in the lamination direction and the lamination plane direction as described above and also the bonding force in the direction perpendicular or substantially perpendicular to the lamination direction between constituent atoms is weak in the dielectric layer 40 fabricated using atomic layer deposition, the separation distance of the gap 30 changes because the structure of the dielectric layer 40 fabricated by atomic layer deposition results in a structure prone to fluctuation of the molecules that constitute this dielectric layer 40 (constituent molecules), the constituent molecules fluctuate as the first electrode 10 or second electrode 20 expands or contracts, and the expansion and contraction of the first electrode 10 or second electrode 20 is not inhibited.

Note that structures that do not impede changes to the separation distance of the gap 30 are not limited to the amorphous structure or the structure prone to fluctuation.

Furthermore, the method for fabricating the dielectric layer 40 is not limited to the methods described above.

Here, the structure of the storage element 1 of according to the first preferred embodiment of the present invention preferably is similar to the structures of ReRAM (resistance RAM (random access memory)), PRAM (phase change RAM), and CBRAM (conductive bridging RAM) in that it includes a thin film that separates electrodes, but differs in multiple points. One example of those is shown below.

In ReRAM and PRAM, the primary locus of resistance change is a change in conductivity of the thin film that separates the electrodes by oxidation-reduction in ReRAM and by crystalline-noncrystalline transitions in PRAM; in CBRAM, the thin film functions as a solid electrolyte, and the copper of the electrode behaves as an ion within it (see, L. Goux et al., "Field-driven ultrafast sub-ns programming in W/$Al_2O_3$/Ti/CuTe-based 1T1R CBRAM system," p. 69, 2012 Symposium on VLSI Technology Digest of Technical Papers, etc.). In the storage element 1 according to the first preferred embodiment of the present invention, however, the separation distance of the gap changes due to the movement of metal atoms that constitute the electrodes into voids or defects within the thin film (dielectric layer 40) that separates the electrodes or nano-level deformations in the first electrode 10 or second electrode 20 that are permitted by the anisotropism of the thin film that separates the electrodes, and the tunnel current changes with these changes.

In ReRAM and PRAM, it is imperative that the substance of the thin film that separates the electrodes have ionic conductivity and that its composition distribution vary, but in the storage element 1 according to the first preferred embodiment of the present invention, the thin film (dielectric layer 40) that separates the electrodes is constituted with a dielectric material which is uniform on a macro level and stable such that its conductivity and crystallinity do not change in the operating process, and this dielectric material causes tunnel current flow between electrodes.

In ReRAM and PRAM, a film thickness of about 10 nm to about 30 nm is needed to ensure resistance as the thickness of the thin film that separates the electrodes, but in the storage element 1 according to the first preferred embodiment of the present invention, the film thickness (layer thickness) of the thin film (dielectric layer 40) that separates the electrodes is preferably about 10 nm or less, in which electrode deformation occurs, and more preferably about 3 nm or less.

The storage element 1 according to the first preferred embodiment of the present invention has a wider range of selectable electrode materials than ReRAM, PRAM, or CBRAM.

The voltage-current characteristics of ReRAM and PRAM are linear, but the voltage-current characteristics of the storage element 1 according to the first preferred embodiment of the present invention exhibit negative resistance.

Figure 2:
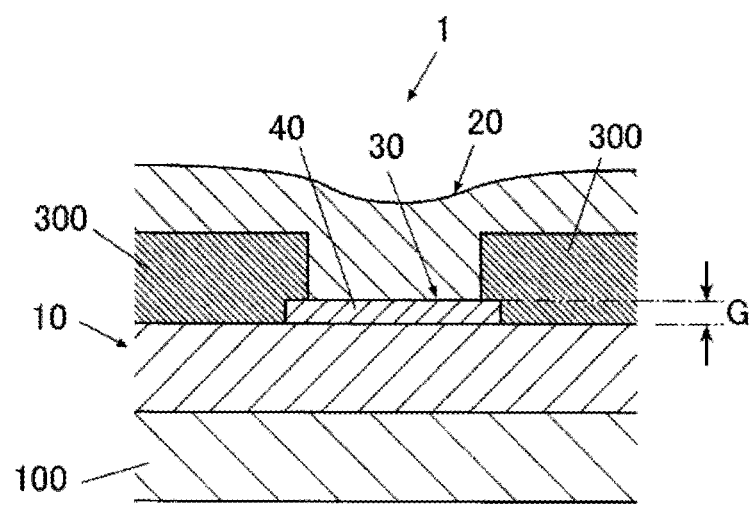
FIG. 2 is a diagram showing in model form one example of the storage element according to the first preferred embodiment of the present invention.

Next, one non-limiting example of a method for manufacturing the storage element 1 of the present preferred embodiment will be described with reference to FIGS. 3A-3C. The storage element 1 of the present preferred embodiment, as shown in FIG. 2, is a vertically structured storage element in which the first electrode 10 and the second electrode 20 are aligned perpendicularly with the top surface of a dielectric substrate 100.

Figure 3A:
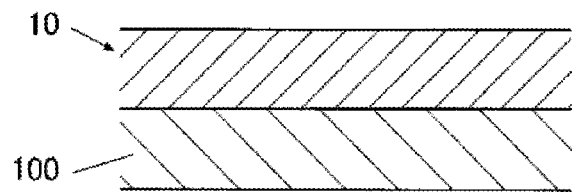
FIGS. 3A-3C are diagrams illustrating one example of a method for manufacturing the storage element shown in FIG. 2.

First, as shown in FIG. 3A, the first electrode 10 is formed on the top surface of the dielectric substrate 100.

Figure 3B:
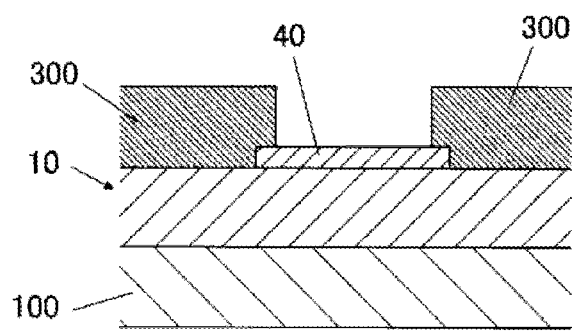

Next, as shown in FIG. 3B, the dielectric layer 40 is formed on the top surface of the first electrode 10, after which a dielectric support layer 300 configured to support the second electrode 20 is formed.

Figure 3C:
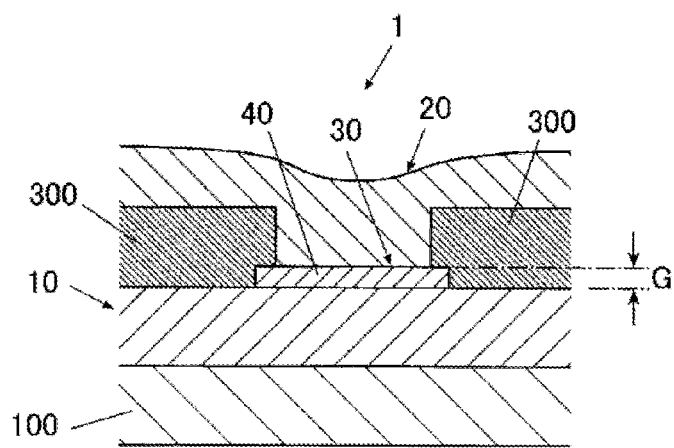

Next, as shown in FIG. 3C, the second electrode 20 is formed on the top surfaces of the dielectric substrate 40 and dielectric support layer 300. In this case, the thickness of the second electrode 20 is preferably a thickness that prevents outside air from entering the gap 30 (dielectric layer 40) through the second electrode 20.

Thus, the storage element 1 of the present preferred embodiment preferably is manufactured according to the non-limiting example described above.

Here, one example of a conventional storage element in which the gap 30 between the first electrode 10 and the second electrode 20 is hollow is a storage element manufactured by forming a spacer layer instead of the dielectric layer 40, forming the second electrode 20, and then selectively removing this spacer layer using a solvent or the like that is able to remove through dissolution only the spacer layer, thereby making the gaps 30 hollow. In contrast, the storage element 1 of the present preferred embodiment does not require removal of the dielectric layer 40 and is therefore manufactured using fewer processes than these conventional storage elements.

Working Example

Various preferred embodiments of the present invention will be described in further detail below based on a concrete working example, but the present invention is in no way limited to such working example.

First, a storage element 1 was fabricated which includes a first electrode 10 made of platinum, a second electrode 20 made of platinum, and a dielectric layer 40 made of AlOx (where x is a number close to 3/2). The dielectric layer 40 was formed by atomic layer deposition.

Figure 4:
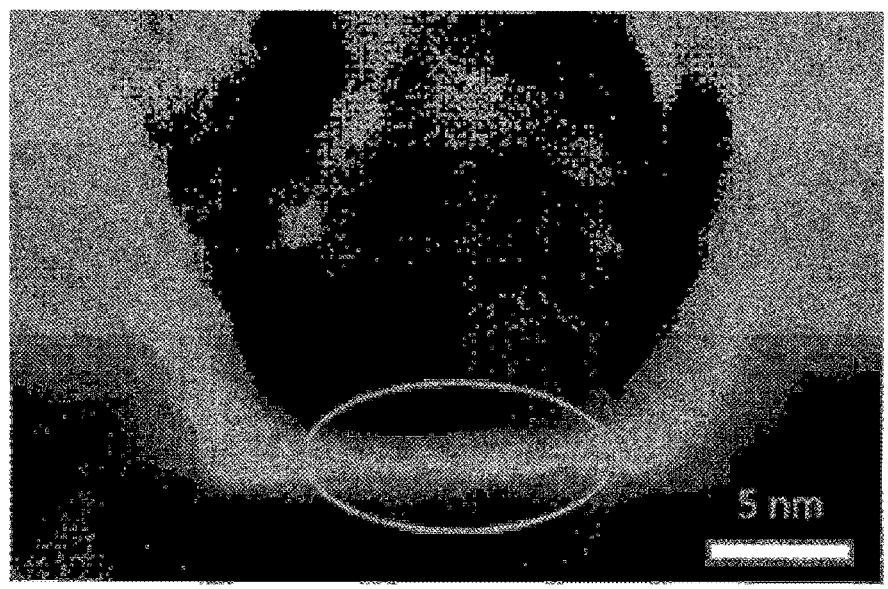
FIG. 4 is a diagram showing a TEM image of the storage element of a working example.

FIG. 4 shows a TEM image of the fabricated storage element 1. The portion enclosed by the white line in FIG. 4 is the portion that corresponds to FIG. 1. This TEM image and X-ray elementary analysis confirmed that an AlOx (where x is a number close to 3/2) film (dielectric layer 40) with a thickness of several nanometers is formed between the first electrode 10 and the second electrode 20. Moreover, it was confirmed from the TEM image that the element density fluctuates within the AlOx (where x is a number close to 3/2) film (dielectric layer 40).

The high-resistance transition voltage and the low-resistance transition voltage were applied repeatedly and alternatingly to the fabricated storage element 1, and the resistance value of the gap 30 that this storage element 1 has was measured after application of each voltage.

Under the application of the high-resistance transition voltage, a pulse voltage was applied with the pulse width (application time for one pulse of voltage) being set at 16 ns.

In addition, under the application of the low-resistance transition voltage, a pulse voltage was applied with the current compliance (current limitation) being set at 2 μA and the pulse width being set at 250 ms.

Figure 5:
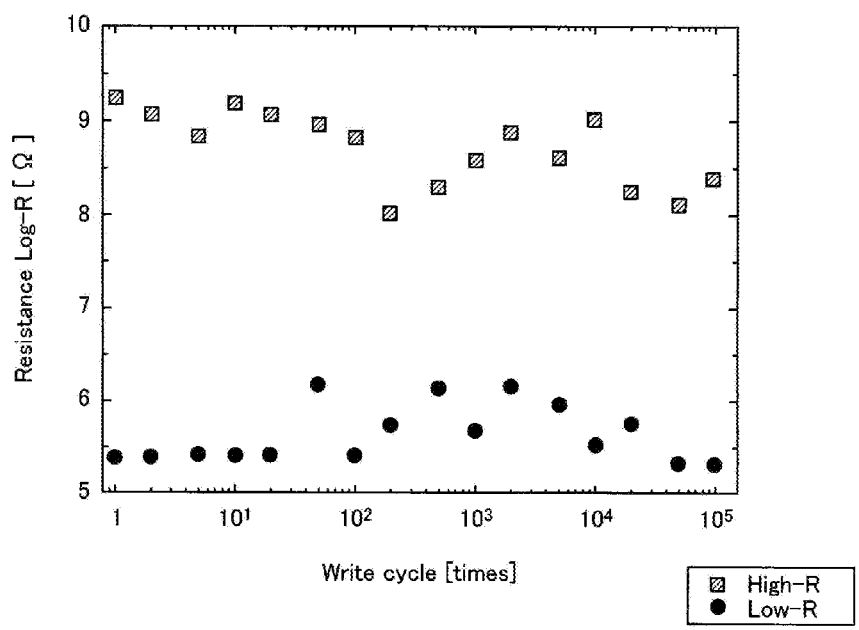
FIG. 5 is a diagram showing changes in the resistance value of the element when a high-resistance transition voltage and a low-resistance transition voltage are repeatedly and alternatingly applied to the storage element of a working example.

The results thereof are shown in FIG. 5.

From the results shown in FIG. 5, it was discovered that stable switching operation is possible even when the high-resistance transition voltage and the low-resistance transition voltage are applied alternatingly for 100,000 repetitions or more. Furthermore, it was confirmed that the movement (transition) from the low resistance state to the high resistance state was also fast, and performance was equal to or better than storage elements in which an AlOx (where x is a number close to 3/2) film (dielectric layer 40) was removed (that is, storage elements in which the gap 30 is hollow).

According to the storage element 1 of the first preferred embodiment described above, the storage element 1 is constituted such that it includes the first electrode 10 and the second electrode 20 that are disposed so as to be separated by a specified gap 30 and the dielectric layer 40 that is provided between the first electrode 10 and the second electrode 20 so as to fill in the gap 30, and such that the separation distance of the gap 30 (gap separation distance G) is changed by the application of a specified voltage to the space between the first electrode 10 and the second electrode 20, such that a switching phenomenon is produced which switches the resistance state between the first electrode 10 and the second electrode 20 between a high resistance state in which it is difficult for tunnel current to flow and a low resistance state in which it is easy for tunnel current to flow.

Therefore, the separation distance of the gap 30 between the first electrode 10 and the second electrode 20 (initial value) is controlled precisely by controlling the thickness of the dielectric layer 40 that is provided so as to fill in the gap (electrode gap) 30 between the first electrode 10 and the second electrode 20, so it is possible to provide a storage element 1 including a gap 30 with a desired separation distance with good reproducibility unaffected by manufacturing disparities.

Moreover, because the gap (electrode gap) 30 between the first electrode 10 and the second electrode 20 is filled in with the dielectric layer 40, it is possible to provide a storage element 1 that hermetically seals the gap 30 in a reliable manner.

Second Preferred Embodiment

Next, the storage element 1 according to a second preferred embodiment of the present invention will be described.

Note that the storage element 1 of the second preferred embodiment is different from the storage element 1 of the first preferred embodiment in that both the first electrode 10 and the second electrode 20 have two-layer structures, while both the first electrode 10 and the second electrode 20 have single-layer structures in the storage element 1 of the first preferred embodiment, for example. Accordingly, the same symbols will be assigned to the elements or portions that have the same configurations as in the first preferred embodiment, and the description thereof will be omitted such that the description will be mainly about differences.

Figure 6:
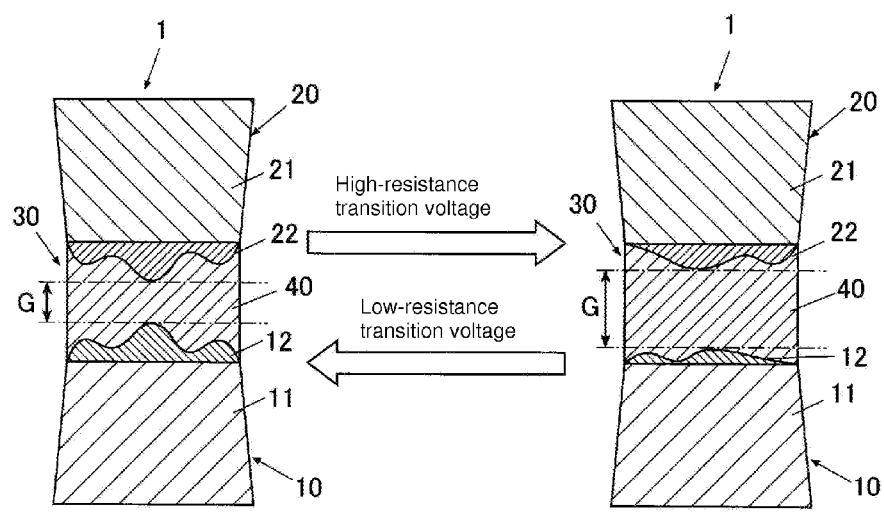
FIG. 6 is a sectional view showing in model form portions of the storage element according to a second preferred embodiment of the present invention.

FIG. 6 is a sectional view showing in model form portions of the storage element 1 of the second preferred embodiment.

In the storage element 1 of the second preferred embodiment, the first electrode 10, as shown in FIG. 6, preferably includes a base portion 11 and a low-melting-point portion 12 made of a substance with a lower melting point than the substance that constitutes the base portion 11, for example. The first electrode 10 preferably has a two-layer structure.

There are no particular restrictions on the material of the base portion 11 (that is, the substance that constitutes the base portion 11) so long as it is conductive. For example, it is preferable that it be at least one material selected from among gold, silver, platinum, palladium, nickel, aluminum, cobalt, chromium, rhodium, titanium, tungsten, tantalum, carbon, or alloys thereof.

The low-melting-point portion 12 is provided on the portion of the base portion 11 that faces the second electrode 20. There are no particular restrictions on the material of the low-melting-point portion 12 (that is, the substance that constitutes the low-melting-point portion 12) as long as its melting point is lower than that of the substance that constitutes the base portion 11 and it is also conductive.

In addition, in the storage element 1 of the second preferred embodiment, the second electrode 20, as shown in FIG. 6, preferably includes a base portion 21 and a low-melting-point portion 22 made of a substance with a lower melting point than the substance of the base portion 21, for example. The second electrode 20 also preferably has a two-layer structure.

There are no particular restrictions on the material of the base portion 21 (that is, the substance that constitutes the base portion 21) so long as it is conductive; for example, it is preferable that it be at least one material selected from among gold, silver, platinum, palladium, nickel, aluminum, cobalt, chromium, rhodium, titanium, tungsten, tantalum, carbon, or alloys thereof.

The low-melting-point portion 22 is provided on the portion of the base portion 21 that faces the first electrode 10. There are no particular restrictions on the material of the low-melting-point portion 22 (that is, the substance that constitutes the low-melting-point portion 22) as long as its melting point is lower than that of the substance that constitutes the base portion 21 and it is also conductive.

Note that the substance that constitutes the base portion 11 on the side of the first electrode 10 and the substance that constitutes the base portion 21 on the side of the second electrode 20 may be the same or different.

Furthermore, the substance that constitutes the low-melting-point portion 12 on the side of the first electrode 10 and the substance that constitutes the low-melting-point portion 22 on the side of the second electrode 20 may be the same or different.

In cases where the substance that constitutes the base portion 11 on the side of the first electrode 10 and the substance that constitutes the base portion 21 on the side of the second electrode 20 are different, it is preferable that the melting point of the substance that constitutes the low-melting-point portion 12 on the side of the first electrode 10 be lower than the melting points of both the substance that constitutes the base portion 11 and the substance that constitutes the base portion 21.

Moreover, in cases where the substance that constitutes the base portion 11 on the side of the first electrode 10 and the substance that constitutes the base portion 21 on the side of the second electrode 20 are different, it is preferable that the melting point of the substance that constitutes the low-melting-point portion 22 on the side of the second electrode 20 be lower than the melting points of both the substance that constitutes the base portion 11 and the substance that constitutes the base portion 21.

It is known that the higher the melting point of the substance that constitutes a nanogap electrode, the higher the voltage value required to switch from a low resistance state to a high resistance state (hereinafter refers to as "switching voltage value"). That is, the higher the melting point of a substance, the harder it is for it to move, while the lower the melting point, the easier it is for the substance to move.

Accordingly, if both the electrode on one side of a nanogap electrode and the electrode on the other side have single-layer structures, and also if the melting point of the substance that constitutes these electrodes is low, for example, then the substance that constitutes these electrodes will be easy to move, so the gap separation distance G (the separation distance of the gap 30) may end up being widened excessively by overshooting of the edge portion when pulses rise and fall with the application of high-resistance transition voltage, noise such as ringing, and the state of the nanogap (gap 30) prior to voltage application. When the gap separation distance G becomes excessively wide, the space between the nanogap electrodes may enter a dielectric state or a state of excessively high resistance, or the nanogap structure itself may break down, which makes it difficult or impossible to transition to the subsequent low-resistance state, which, in turn, makes stable switching operations difficult.

Meanwhile, if both the electrode on one side of the nanogap electrode and the electrode on the other side have single-layer structures, and also if the melting point of the substance that constitutes these electrodes is high, for example, then the substance that constitutes these electrodes will be difficult to move, so it may not fully transition to the high resistance state even when the high-resistance transition voltage is applied. Thus, in this case as well, stable switching operations will become difficult.

For this reason, in the present preferred embodiment, the gap 30 is preferably defined by the low-melting-point portions 12 and 22 made of a substance with a relatively low melting point (that is, a substance that moves relatively easily), and the low-melting-point portions 12 and 22 are sandwiched between the base portions 11 and 21 which are made of a substance with a relatively high melting point (that is, a substance that is relatively difficult to move). By doing so, the base portions 11 and 21 define and function as stoppers that limit the movement of the low-melting-point portions 12 and 22, so it is possible to prevent the low-melting-point portions 12 and 22 from moving excessively and from excessively widening the gap separation distance G when transitioning to the high resistance state.

Accordingly, as the high-resistance transition voltage is applied, the gap separation distance G does not become excessively wide, the space between the nanogap electrodes does not enter a dielectric state or a state of excessively high resistance, and the nanogap structure itself does not break down.

In addition, because the gap separation distance G does not widen excessively with the application of the high-resistance transition voltage, the voltage value can be set high for the high-resistance transition voltage. Therefore, the problem of not fully transitioning to the high resistance state even when the high-resistance transition voltage is applied is prevented from occurring.

Furthermore, because both the first electrode 10 and the second electrode 20 preferably include the low-melting-point portions 12 and 22 that move with the application of high-resistance transition voltage or low-resistance transition voltage, the gap separation distance G changes more with the voltage application, thus enabling a more stable switching operation. Moreover, the element can be designed without having to consider the polarity when driven.

Here, in order to maintain a nanometer order gap separation distance G, the low-melting-point portions 12 and 22 are made thicker, the greater the separation distance becomes between the base portion 11 on the side of the first electrode 10 and the base portion 21 on the side of the second electrode 20. However, the thicker the low-melting-point portions 12 and 22, the wider the range of movement of the low-melting-points 12 and 22, so the likelihood of the gap separation distance G becoming excessively large increases. That is, if the separation distance between the base portions 11 and 22 is large, the base portions 11 and 21 become more likely to be unable to serve as stoppers.

For this reason, in the present preferred embodiment, a limit is established on the separation distance between the base portions 11 and 21 such that the base portions 11 and 21 reliably serve their roles as stoppers. In concrete terms, the separation distance between the base portions 11 and 21 is set to a separation distance that is able to generate tunnel current.

The phrase "separation distance that is able to generate tunnel current" refers to a separation distance within the range over which tunnel current flows between the base portions 11 and 21, and it does not mean that there is direct conduction between the base portions 11 and 21 when voltage is applied to the storage element 1.

For example, in the case of a pair of electrodes made only of gold (Au), tunnel current becomes unable to flow when the separation distance between the pair of electrodes exceeds about 13 nm. Accordingly, when the substance that constitutes the base portions 11 and 21 is gold, the "separation distance that is able to generate tunnel current" preferably is a separation distance of about 13 nm or less, and the base portions 11 and 21 are disposed so as to face each other separated by about 13 nm or less, for example. Furthermore, the low-melting-point portions 12 and 22 made of a substance with a lower melting point than gold are disposed within this separation distance of about 13 nm or less so as to face each other across a separation distance of the gap separation distance G; when voltage is applied to the storage element 1, tunnel current flows between the low-melting-point portions 12 and 22.

In the present preferred embodiment, a voltage at the voltage value which does not spread the separation distance between the base portions 11 and 21 but which widens the gap 30 (that is, widens the gap separation distance G) is applied as the high-resistance transition voltage.

In concrete terms, in the case of the present preferred embodiment, a voltage is applied, as the high-resistance transition voltage, with a voltage value determined considering the effects of metal wiring resistance and the like from among the voltage values that are less than the switching voltage value of the substance that constitutes the base portions 11 and 21 but greater than or equal to the switching voltage value of the substance that constitutes the low-melting-point portions 12 and 22.

Consequently, the smaller the difference between the switching voltage value of the substance that constitutes the base portions 11 and 21 and the switching voltage value of the substance that constitutes the low-melting-point portions 12 and 22, the more likely that the gap separation distance G will be widened excessively because, with the application of the high-resistance transition voltage, noise or the like will move not just the low-melting-point portions 12 and 22 but also the base portions 11 and 21, which widens the separation distance between the base portions 11 and 21.

Therefore, larger differences between the switching voltage value of the substance that constitutes the base portions 11 and 21 and the switching voltage value of the substance that constitutes the low-melting-point portions 12 and 22 are more desirable. That is, larger differences between the melting point of the substance that constitutes the base portions 11 and 21 and the melting point of the substance that constitutes the low-melting-point portions 12 and 22 are more desirable. This makes the base portions 11 and 21 less vulnerable to the effects of noise and the like, so excessive spreading of the gap separation distance G is effectively prevented.

In concrete terms, when selecting the substance that constitutes the base portions 11 and 21 and the substance that constitutes the low-melting-point portions 12 and 22 from among, for example, gold (melting point: 1064° C.), silver (melting point: 962° C.), platinum (melting point: 1769° C.), palladium (melting point: 1552° C.), nickel (melting point: 1455° C.), aluminum (melting point: 660° C.), cobalt (melting point: 1495° C.), chromium (melting point: 1857° C.), rhodium (melting point: 1960° C.), titanium (melting point: 1666° C.), tungsten (melting point: 3047° C.), tantalum (melting point: 2985° C.), and carbon (sublimation point: 3900 K, no melting point at ordinary pressure), it is preferable that the substance that constitutes the base portions 11 and 21 be tungsten, tantalum, or carbon, and that the substance that constitutes the low-melting-point portions 12 and 22 be gold, silver, platinum, palladium, nickel, aluminum, cobalt, chromium, rhodium, or titanium.

Figure 7:
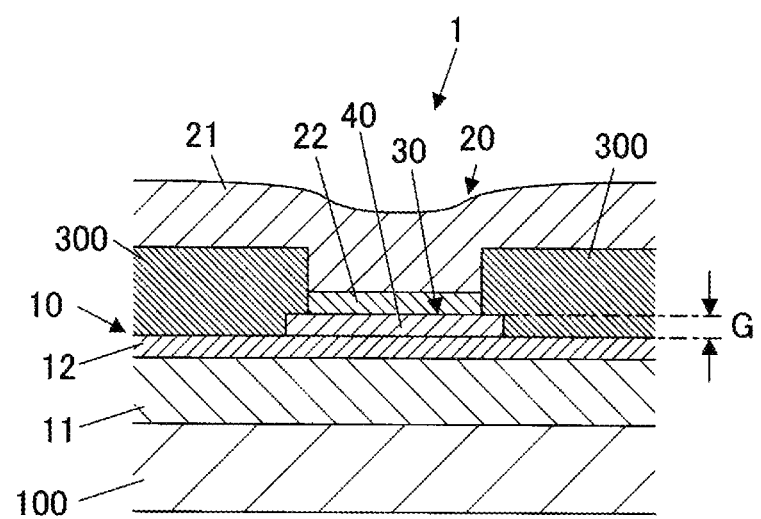
FIG. 7 is a diagram showing in model form one example of the storage element according to the second preferred embodiment of the present invention.

Next, one non-limiting example of a manufacturing method of the storage element 1 of the present preferred embodiment will be described with reference to FIG. 8. The storage element 1 of the present preferred embodiment, as shown in FIG. 7, is a vertically structured storage element in which the first electrode 10 and the second electrode 20 preferably are aligned perpendicularly or substantially perpendicularly to the top surface of the dielectric substrate 100.

Figure 8A:
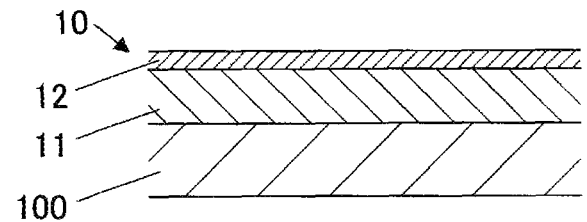
FIGS. 8A-8C are diagrams illustrating one example of a method for manufacturing the storage element shown in FIG. 7.

First, as shown in FIG. 8A, the first electrode 10 is formed on the top surface of the dielectric substrate 100. In concrete terms, the base portion 11 on the side of the first electrode 10 is formed on the top surface of the dielectric substrate 100, after which the low-melting-point portion 12 on the side of the first electrode 10 is formed on the top surface of the base portion 11.

Figure 8B:
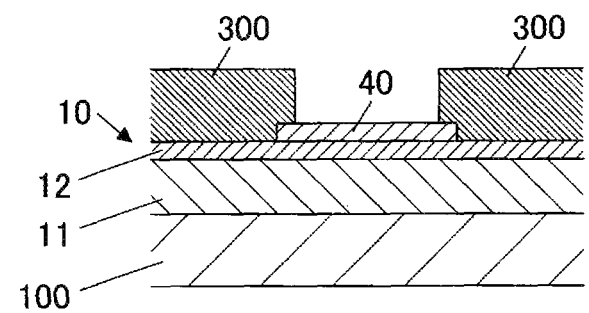

Next, as shown in FIG. 8B, the dielectric layer 40 is formed on the top surface of the first electrode 10, and the dielectric support layer 300 configured to support the second electrode 20 is then formed.

Figure 8C:
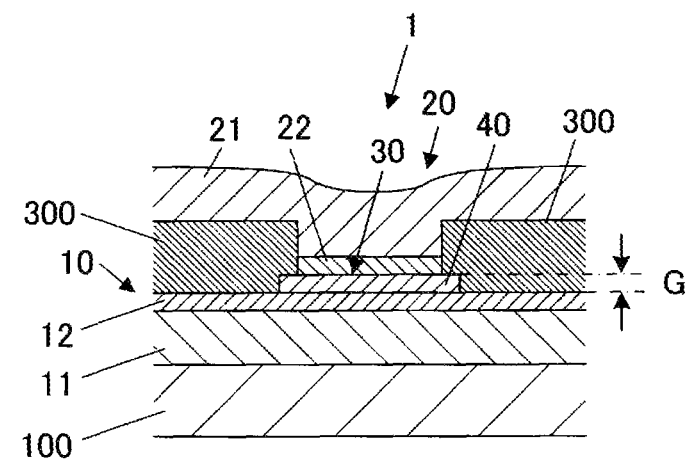

Next, as shown in FIG. 8C, the second electrode 20 is formed on the top surfaces of the dielectric layer 40 and the dielectric support layer 300. In concrete terms, the low-melting-point portion 22 on the side of the second electrode 20 is formed on the top surface of the dielectric layer 40, after which the base portion 21 on the side of the second electrode 20 is formed on the top surfaces of the low-melting-point portion 22 and the dielectric support layer 300.

The storage element 1 of the present preferred embodiment may preferably be manufactured in this manner.

According to the storage element 1 of the second preferred embodiment described above, the first electrode 10 and the second electrode 20 respectively include the base portions 11 and 21 that are respectively in contact with the first electrode 10 and the second electrode 20 or replace at least one of the electrodes, the base portion 11 on the side of the first electrode 10 and the base portion 21 on the side of the second electrode 20 face each other across a separation distance configured to produce a tunnel current, the first electrode 10 and the second electrode 20 respectively include the low-melting-point portions 12 and 22 in the portions where the base portions 11 and 21 face each other, the low-melting-point portion 12 on the side of the first electrode 10 is made of a substance with a lower melting point than the substance that constitutes the base portion 11 on the side of the first electrode 10, and the low-melting-point portion 22 on the side of the second electrode 20 is made of a substance with a lower melting point than the substance that constitutes the base portion 21 on the side of the second electrode 20.

Accordingly, because the base portions 11 and 21 work as stoppers to prevent excessive movement of the low-melting-point portions 12 and 22, when transitioning to the high resistance state, the low-melting-point portions 12 and 22 are prevented from moving excessively and excessively widening the gap 30. Consequently, the next low-resistance transition operation becomes easy to execute, thus enabling a stable switching operation.

Note that it is sufficient if at least one among the first electrode 10 and the second electrode 20 includes the low-melting-point portion. It is possible to make either one of the first electrode 10 or the second electrode 20 a two-layer structure including a base portion and a low-melting-point portion, while making the other a single-layer structure that includes a base portion but does not include a low-melting-point portion.

If only one of the first electrode 10 and the second electrode 20 includes a low-melting-point portion, then the gap 30 will be the space between this low-melting-point portion and the base portion on the other side. In this case, furthermore, it is sufficient if the melting point of the substance that constitutes this low-melting-point portion is lower than the melting point of the substance that constitutes the base portion of at least one of the sides, and it is preferable if it is lower than both the melting point of the substance of the base portion of one of the sides and the melting point of the substance of the base portion on the other side.

Moreover, if only either the first electrode 10 or the second electrode 20 includes a low-melting-point portion, this low-melting-point portion is preferably provided in the one of the first electrode 10 and the second electrode 20 that has the relatively higher potential when voltage is applied.

In concrete terms, in cases where either the first electrode 10 or the second electrode 20 alone includes a low-melting-point portion, and if the first electrode 10 has a relatively higher potential and the second electrode 20 has a relatively lower potential, for example, when the high-resistance transition voltage or the low-resistance transition voltage is applied, then a low-melting-point portion is preferably provided in the first electrode 10.

If the first electrode 10 has a relatively higher potential and the second electrode 20 has a relatively lower potential when the high-resistance transition voltage or the low-resistance transition voltage is applied, then both the first electrode 10 and the second electrode 20 may have two-layer structures including base portions and low-melting-point portions as in the present preferred embodiment, or it is also possible to configure the first electrode 10 as a two-layer structure including a base portion 11 and a low-melting-point portion 12 and to configure the second electrode 20 as a single-layer structure that includes a base portion 21 but does not include a low-melting-point portion 22.

In addition, if the second electrode 20 has a relatively higher potential and the first electrode 10 has a relatively lower potential when the high-resistance transition voltage or the low-resistance transition voltage is applied, then both the first electrode 10 and the second electrode 20 may have two-layer structures including base portions and low-melting-point portions as in the present preferred embodiment, or it is also possible to configure the second electrode 20 as a two-layer structure including a base portion 21 and a low-melting-point portion 22 and to configure the first electrode 10 as a single-layer structure that includes a base portion 11 but does not include a low-melting-point portion 12.

The movement of atoms that constitute the electrode by electromigration is one possible cause of the gap separation distance G spreading when the high-resistance transition voltage is applied. Providing a low-melting-point portion made of a substance that is easy to move at least on the side of the electrode that has the relatively higher potential makes it easier for the gap separation distance G to widen, thus enabling a more stable switching operation.

Note that the preferred embodiments disclosed herein merely constitute illustrative examples in all respects and are nonrestrictive. The scope of the present invention is indicated not by the description given above but rather by the scope of the claims, and includes all modifications equivalent and within the scope of the claims.

For instance, the storage elements of the first preferred embodiment and second preferred embodiment do not have to be vertically structured storage elements in which the first electrode 10 and the second electrode 20 are disposed so as to be aligned in the direction perpendicular or substantially perpendicular to the top surface of the dielectric substrate 100, and the storage elements may also be horizontally structured storage elements in which the first electrode 10 and the second electrode 20 are disposed so as to be aligned in the direction parallel or substantially parallel to the top surface of the dielectric substrate 100.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A storage element comprising:
    a first electrode and a second electrode separated by a gap; and
    a dielectric layer located in the gap between the first electrode and the second electrode; wherein
    a separation distance of the gap changes in response to application of a voltage to the gap between the first electrode and the second electrode;
    a resistance state between the first electrode and the second electrode switches between a high resistance state and a low resistance state, according to the separation distance of the gap; and
    the dielectric layer is a dielectric thin film with a softened inter-atomic bond structure.

2. The storage element according to claim 1, wherein the dielectric layer is anisotropic in a lamination direction and a lamination plane direction.

3. The storage element according to claim 1, wherein the dielectric layer has a thickness of about 3 nm or less.

4. The storage element according to claim 1, wherein
    the first electrode and the second electrode each include a base portion;
    the base portion on the first electrode side and the base portion on the second electrode side face each other across the separation distance;
    the separation distance is set to enable a tunnel current between the first electrode and the second electrode to be generated;
    at least one of the first electrode and the second electrode includes a low-melting-point portion in the portion where the base portions face each other;
    when the first electrode includes the low-melting-point portion, the low-melting-point portion is made of a substance with a melting point lower than a substance of the base portion on the first electrode side; and
    when the second electrode includes the low-melting-point portion, the low-melting-point portion is made of a substance with a melting point lower than a substance of the base portion on the second electrode side.

5. The storage element according to claim 4, wherein the low-melting-point portion is provided at least in one of the first electrode and the second electrode that has a relatively higher potential when the voltage is applied.

6. The storage element according to claim 4, wherein the low-melting-point portion is provided in both the first electrode and the second electrode.

7. The storage element according to claim 1, wherein the dielectric layer is arranged to fill the gap.

8. The storage element according to claim 1, wherein the dielectric layer is arranged to hermetically seal the gap.

9. The storage element according to claim 1, wherein the dielectric layer is configured such that the separation distance of the gap changes due to movement of metal atoms into voids or defects within the dielectric layer.

10. The storage element according to claim 1, wherein each of the first electrode and the second electrode has a single layer structure.

11. The storage element according to claim 1, wherein one of the first electrode and the second electrode has a single layer structure and the other of the first electrode and the second electrode has a double layer structure.

12. The storage element according to claim 1, wherein both of the first electrode and the second electrode have a double layer structure.

13. The storage element according to claim 1, wherein
the first electrode and the second electrode each include a base portion and a low-melting point portion;
the gap defined by the low-melting-point portions made of a substance with a relatively low melting point and the low-melting-point portions are sandwiched between the base portions which are made of a substance with a relatively high melting point.

14. The storage element according to claim 1, wherein
the first electrode and the second electrode each include a base portion and a low-melting point portion;
the base portions define and function as stoppers that limit movement of the low-melting-point portions to prevent the low-melting-point portions from moving and widening the separation distance beyond a predetermined amount when transitioning to the high resistance state.

15. The storage element according to claim 1, wherein one of the first electrode and the second electrode includes both a base portion and a low-melting point portion, and the other of the first electrode and the second electrode includes a base portion but does not include a low-melting point portion.

16. The storage element according to claim 1, wherein the storage element is a vertically structured storage element.

17. The storage element according to claim 1, wherein the storage element is a horizontally structured storage element.

\* \* \* \* \*